US010189002B2

(12) United States Patent
Lynch et al.

(10) Patent No.: US 10,189,002 B2
(45) Date of Patent: *Jan. 29, 2019

(54) APPARATUS FOR FLOW-THROUGH OF ELECTRIC ARCS

(71) Applicant: MAGNEGAS CORPORATION, Tarpon Springs, FL (US)

(72) Inventors: Christopher Lynch, Largo, FL (US); Scott Marton, Tarpon Springs, FL (US); Jack Michael Armstrong, Pinellas Park, FL (US); Mike Rodriguez, Tarpon Springs, FL (US); Richard Conz, Seminole, FL (US)

(73) Assignee: Magnegas Corporation, Clearwater, FL (US)

( * ) Notice: Subject to any disclaimer, the term of this patent is extended or adjusted under 35 U.S.C. 154(b) by 54 days.

This patent is subject to a terminal disclaimer.

(21) Appl. No.: 14/529,723

(22) Filed: Oct. 31, 2014

(65) Prior Publication Data

US 2015/0122632 A1 May 7, 2015

Related U.S. Application Data

(60) Provisional application No. 61/898,839, filed on Nov. 1, 2013.

(51) Int. Cl.
*B01J 19/08* (2006.01)
*H05H 1/48* (2006.01)

(52) U.S. Cl.
CPC ............ *B01J 19/088* (2013.01); *H05H 1/48* (2013.01); *B01J 2219/0809* (2013.01);
(Continued)

(58) Field of Classification Search
CPC ............ B01J 19/088; B01J 2219/0809; B01J 2219/0816; B01J 2219/0869; B01J 2219/0875; B01J 2219/0877; B01J 2219/0898; B01J 2219/0818; B01J 2219/0822; B01J 2219/0828; B01J 2219/083; B01J 2219/0832; B01J 2219/0841; B01J 2219/0871; B01J 2219/0883; B01J 2219/0884; B01J 2219/0894; B01J 19/122; B01J 2219/0845; H05H 1/48; H05H 2245/121; C09D 7/63;
(Continued)

(56) References Cited

U.S. PATENT DOCUMENTS 603,058 A 4/1898 Eldridge
3,003,939 A 10/1961 Rouy
(Continued)

*Primary Examiner* — Xiuyu Tai
(74) *Attorney, Agent, or Firm* — Larson & Larson, P.A.; Frank Liebenow; Justin P. Miller

(57) ABSTRACT

A flow-through electric arc system includes a chamber within an insulated sleeve having an anode at one end of the insulated sleeve and a cathode at a distal end of the insulated sleeve. Fluid flows from an inlet of the chamber, through the insulated sleeve where it is exposed to an electric arc formed between the anode and cathode, and then flows out of an outlet of the chamber. By way of increasing the flow rate of the fluid, bi-products that are released from a reaction of the fluid to the electric arc are flushed by the fluid and at least some of the bi-products are precluded from accumulating on either of the anode, cathode, or both.

9 Claims, 7 Drawing Sheets

(52) U.S. Cl.
CPC ............ *B01J 2219/0816* (2013.01); *B01J 2219/0869* (2013.01); *B01J 2219/0875* (2013.01); *B01J 2219/0877* (2013.01); *B01J 2219/0898* (2013.01); *H05H 2245/121* (2013.01)

(58) Field of Classification Search
CPC ......... C01B 3/00; C01B 13/00; C02F 1/4608; C02F 2101/18; C10G 15/08; C10L 3/00; C10L 5/00; G21K 1/00; H01F 1/00; Y02E 60/324; Y10S 422/906
See application file for complete search history.

(56) References Cited

U.S. PATENT DOCUMENTS

| | | | |
|---|---|---|---|
| 3,992,277 A | 11/1976 | Trieschmann et al. | |
| 4,054,513 A | 10/1977 | Windle | |
| 4,089,770 A | 5/1978 | Lemke | |
| 4,229,307 A | 10/1980 | Lowe et al. | |
| 4,369,102 A | 1/1983 | Galluzzo et al. | |
| 4,566,961 A | 1/1986 | Diaz et al. | |
| 4,567,343 A | 1/1986 | Sullivan et al. | |
| 4,683,146 A | 7/1987 | Hirai et al. | |
| 5,026,484 A | 6/1991 | Juvan | |
| 5,069,765 A | 12/1991 | Lewis | |
| 5,159,900 A | 11/1992 | Dammann et al. | |
| 5,227,038 A | 7/1993 | Smalley et al. | |
| 5,319,176 A | 6/1994 | Alvi et al. | |
| 5,343,699 A | 9/1994 | McAlister | |
| 5,399,829 A | 3/1995 | Ogilvie | |
| 5,417,817 A | 5/1995 | Dammann et al. | |
| 5,435,274 A | 7/1995 | Richardson, Jr. | |
| 5,482,601 A | 1/1996 | Ohshima et al. | |
| 5,692,459 A | 12/1997 | Richardson, Jr. | |
| 5,792,325 A | 8/1998 | Richardson, Jr. | |
| 5,792,532 A | 8/1998 | Richardson, Jr. | |
| 5,826,548 A | 10/1998 | Richardson, Jr. | |
| 6,113,748 A | 9/2000 | Richardson, Jr. | |
| 6,153,058 A | 11/2000 | Richardson, Jr. | |
| 6,183,604 B1 | 2/2001 | Santilli | |
| 6,187,206 B1 * | 2/2001 | Bernier | B01J 19/088 159/47.3 |
| 6,263,838 B1 | 7/2001 | Richardson, Jr. | |
| 6,299,656 B1 | 10/2001 | Richardson, Jr. | |
| 6,299,738 B1 | 10/2001 | Richardson, Jr. | |
| 6,314,918 B1 | 11/2001 | McFarland et al. | |
| 6,421,500 B2 | 7/2002 | Wittle et al. | |
| 6,540,966 B1 | 4/2003 | Santilli | |
| 6,663,752 B2 | 12/2003 | Santilli | |
| 6,673,322 B2 | 1/2004 | Santilli | |
| 6,926,872 B2 | 8/2005 | Santilli | |
| 7,105,079 B2 | 9/2006 | Waldeck et al. | |
| 7,780,924 B2 | 8/2010 | Santilli | |
| 8,236,150 B2 | 8/2012 | Santilli | |
| 2001/0038087 A1 * | 11/2001 | Santilli | B01J 19/088 252/62.51 R |
| 2003/0051992 A1 | 3/2003 | Rappa et al. | |
| 2003/0133855 A1 | 7/2003 | Santilli | |
| 2009/0235637 A1 | 9/2009 | Foret | |
| 2011/0303532 A1 | 12/2011 | Foret | |
| 2012/0000787 A1 | 1/2012 | Santilli | |

* cited by examiner

APPARATUS FOR FLOW-THROUGH OF ELECTRIC ARCS

CROSS-REFERENCE TO RELATED APPLICATION

This application is a non-provisional application of U.S. patent application Ser. No. 61/898,839, filed Nov. 1, 2013, the disclosure of which is hereby incorporated by reference.

FIELD

The invention deals with the processing of a fluid by an electric arc between two electrodes. The invention provides for an efficient flow of a fluid feedstock through the plasma formed by the arc.

BACKGROUND

Electric arcs have been used to process fluids as evidenced by, for example, U.S. Pat. No. 8,236,150 to Ruggero Maria Santilli, issued Aug. 7, 2012 and U.S. Pat. No. 7,780,924 to Ruggero Maria Santilli, issued Aug. 24, 2010. In such, it has been recognized that for some fluids, it is desired to expose a large percentage of the fluid to the electric arc for many reasons including efficient conversion to combustible gas and for disabling of certain microbes (as when the fluid is sewage).

In prior systems, the fluid was pumped directly through the electrodes that produced the arc, through a channel formed within one or both electrodes of the arc, as in the noted patents to Santilli. When processing certain fluids, notably carbon-based fluids such as petroleum-based oils, systems of the prior art often realized buildup of carbon on one of the electrodes, requiring periodic shutting down of the reactor to replace or clean the electrode. It is desired to operate the reactor for as long as possible before replacing or servicing the electrodes, which was addressed partially by prior disclosures having moving electrodes that allowed for tuning of the electrodes by moving one or both electrodes closer, farther, or to a different position with respect to the other electrode. As the electrode accumulates carbon or as the electrode erodes (e.g., gives up carbon) the voltage, fluid flow, and position of the electrodes are adjusted to maintain an optimal arc. Such mechanisms are useful in extending the non-stop operational time of these reactors, but these mechanisms have limited ability to reduce buildup of carbon on the electrodes, especially when processing carbon or petroleum based fluids such as used motor oil, crude oil, vegetable oil, used cooking oil, used motor oil, or any fluids with hydrocarbon structures. For example, when electrodes are submerged in such fluids and an arc is formed between the electrodes, carbon bi-products are separated from the fluids and deposited on one or both of the electrodes, causing substantial buildup of such byproducts on the electrodes.

What is needed is a system that will efficiently flow a fluid through an electric arc, exposing as much of the fluid as possible to the plasma created by the electric arc, while reducing accumulation of carbon bi-products on the electrodes that produce the electric arc.

SUMMARY

A flow-through electric arc system is disclosed including a chamber within an electrically insulated sleeve having an anode at one end of the insulated sleeve and a cathode at a distal end of the insulated sleeve. Fluid flows from an inlet, through the insulated sleeve where it is exposed to an electric arc formed between the anode and cathode, and then flows out of an outlet.

In another embodiment, a method of exposing a fluid to an electric arc is disclosed including flowing of the fluid through a chamber within an insulated sleeve while concurrently forming an electric arc within the insulated sleeve.

In another embodiment, a method of exposing a fluid to an arc for the production of a gas is disclosed. The method includes forming the arc between two electrodes that are housed within a bore within a sleeve. The sleeve has an input end, a central area, and an output end. The fluid flows from the input end of the sleeve, through the bore within the sleeve, and out of the output end of the sleeve at a velocity, such that, carbon bi-products that are released from the fluid by reaction of the fluid with the arc are flushed out of the sleeve along with gases produced by the fluid being exposed to the arc and any fluid that remains and at least some of the carbon bi-products that are released from the fluid by the reaction are prevented from accumulating on the electrodes.

In another embodiment, a system for the production of a gas from a fluid is disclosed. The system includes an anode connected to a first polarity of power and a cathode connected to a second, opposing polarity of power. The cathode is separated from the anode by a gap, whereby a voltage differential between the anode and the cathode forms an arc there between. The system includes a sleeve having a bore that is configured to surround at least the gap between the anode and the cathode. An input port is fluidly interfaced to a first end of the bore and an output port is fluidly interfaced to a second end of the bore. A device such as a pump flows (injects) the fluid into the input port and the fluid flows from the input port, through the bore of the sleeve, and out of the output port at a velocity, such that, carbon bi-products that are released from the fluid by reaction of the fluid with the arc are flushed out of the sleeve along with gases produced by the fluid being exposed to the arc and any fluid that remains. At least some of the bi-products that are released from the fluid by the reaction are therefore prevented from accumulating on either the anode or the cathode.

In another embodiment, a system for the production of a gas from a carbon-based fluid is disclosed. The system has an anode connected to a first polarity of power and a cathode connected to a second, opposing polarity of power, in which the cathode is separated from the anode by a gap and whereby a voltage differential between the anode and the cathode forms an arc there between. The system includes a ceramic sleeve that has a longitudinal bore and the longitudinal bore surrounds at least the gap between the anode and the cathode. A metal vessel body surrounds or encases the outer surface of the sleeve. There is an input port fluidly interfaced to a first end of the longitudinal bore and an output port fluidly interfaced to a second end of the longitudinal bore. A pump flows the carbon-based fluid from the input port, through the longitudinal bore of the sleeve, and out of the output port at a velocity, such that, carbon bi-products that are released from the carbon-based fluid by reaction of the carbon-based fluid with the arc are flushed out of the longitudinal bore along with gases produced by the fluid being exposed to the arc along with any of the original un-processed fluid that remains. In such, at least some of the carbon bi-products that are released from the carbon-based fluid by the reaction are prevented from accumulating on either of the electrodes.

BRIEF DESCRIPTION OF THE DRAWINGS

The invention can be best understood by those having ordinary skill in the art by reference to the following detailed description when considered in conjunction with the accompanying drawings in which.

DETAILED DESCRIPTION

Figure 1:
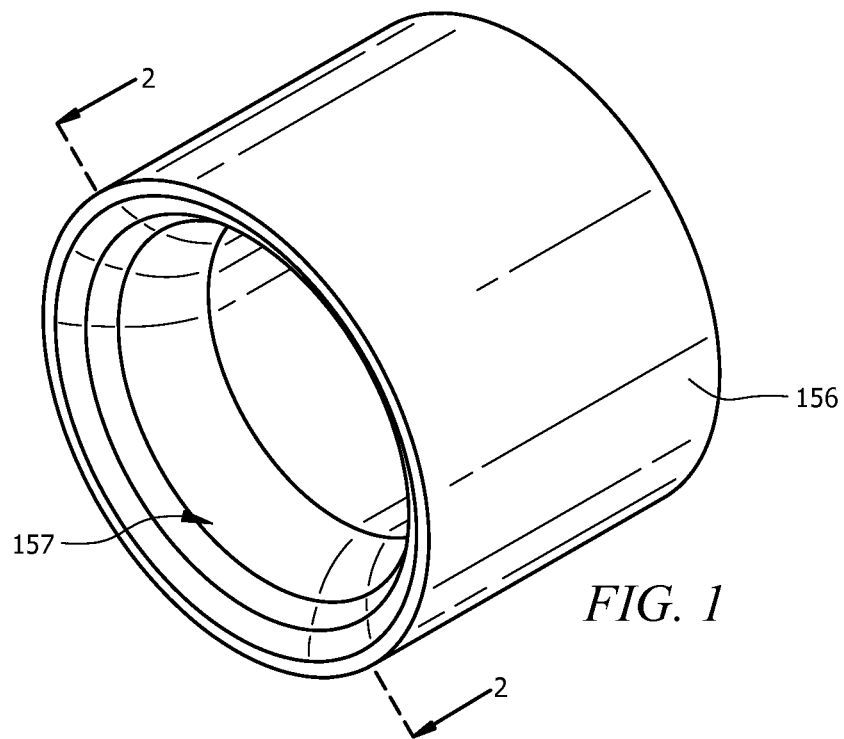
FIG. 1 illustrates a perspective view of a first, venturi style restrictor for a flow-through arc apparatus.

Reference will now be made in detail to the presently preferred embodiments of the invention, examples of which are illustrated in the accompanying drawings. Throughout the following detailed description, the same reference numerals refer to the same elements in all figures.

In general, one goal of the disclosed device is to enclose an arc within a restrictor 56/156/256 and flow a fluid through the restrictor at a velocity such that as carbon particles are released from the fluid by the arc, the carbon particles are swept away from the arc to limit buildup of these carbon bi-products on the electrodes creating the arc.

Throughout this description and claims, the term "insulator" refers primarily to a materials resistance to conduction of electricity, though it is fully anticipated that electrical insulators are sometime insulators to other forms of energy such as heat and light.

Figure 2:
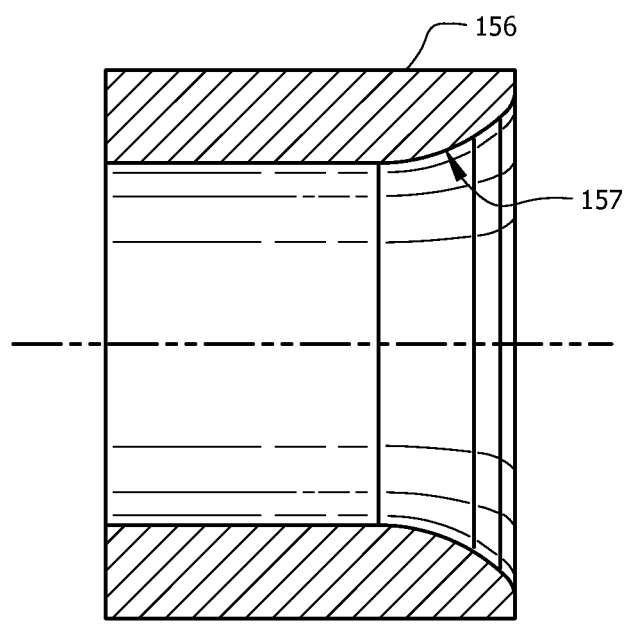
FIG. 2 illustrates a cut-away view along lines 2-2 of FIG. 1, the first, venturi style restrictor for a flow-through arc apparatus.

Referring to FIGS. 1 and 2, views of a first restrictor 156 for a flow-through arc vessel 9 are shown. Although any shape and configuration of a flow restrictor 156 is anticipated, in the example shown, the flow restrictor 156 is substantially tubular having an inner surface that narrows due to a taper 157 formed or molded at the input of the flow restrictor 156. As will be shown with FIG. 8, as fluid is pumped through the flow restrictor 156, the velocity of the flow of fluid increases as the cross-sectional area of the flow restrictor 156 decreases. This velocity of the fluid reduces accumulation of bi-products onto the electrodes 27/67 (see FIGS. 6-9) since bi-products that are freed from the fluid by an electric arc are swept away by the flowing fluid before having a chance to deposit on the electrodes 27/67. For example, for a carbon-based fluid such as motor oil (used or new), cooking oil (used or new), and petroleum, the velocity of the fluid forces at least some of the carbon bi-products that are released from this fluid by the arc to be swept away with the fluid instead of allowing these carbon bi-products to deposit on the electrodes 27/67, which would eventually reduce arc efficiency and require maintenance or replacement of the electrodes 27/67. Such buildup of carbon particles enlarges the electrodes 27/67 and eventually, the enlarged electrodes 27/67 become either a restriction to the fluid flow or cause short between the electrodes 27/67 (see FIGS. 6-9) reducing efficiency, operational time, and eventually extinguishing the arc. Note that throughout this description, carbon bi-product buildup is addressed, though it is fully anticipated that, for other fluids, other bi-products are similarly prevented from building up on one or both electrodes 27/67.

Figure 3:
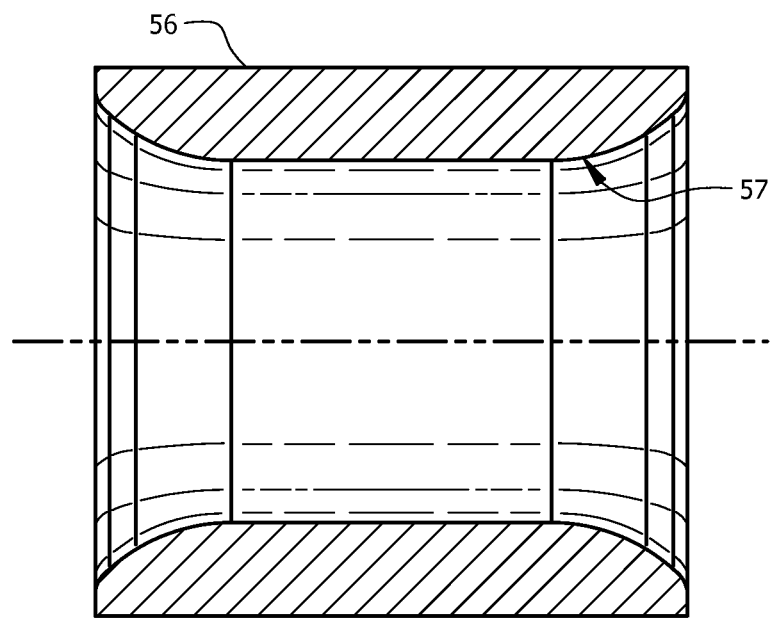
FIG. 3 illustrates a perspective view of a second, tapered restrictor for a flow-through arc apparatus.

Referring to FIG. 3, a view of a second, venturi-type restrictor 56 for a flow-through arc vessel 9 is shown. Although any shape and configuration of a flow restrictor 56 is anticipated, in the example shown, the flow restrictor 56 is substantially tubular having an inner surface that narrows due to a taper 57 formed or molded at the input of the flow restrictor 56 and then expands at a distal end due to a reverse taper 59. As will be shown with FIG. 8, as fluid is pumped through the flow restrictor 56, the velocity of the flow of fluid increases as the cross-sectional area of the flow restrictor 56 decreases. This velocity of the fluid reduces accumulation of carbon bi-products onto the electrodes 27/67 since bi-products that are freed from the fluid by an electric arc are swept away by the flowing fluid before having a chance to deposit on the electrodes 27/67. For example, for a carbon-based fluid such as motor oil (used or new), cooking oil (used or new), and petroleum, the velocity of the fluid forces at least some of the carbon bi-products that are released from this fluid by the arc to be swept away with the fluid instead of allowing these carbon bi-products to deposit on the electrodes 27/67, which would eventually reduce arc efficiency and require maintenance or replacement of the electrodes 27/67. Such buildup of carbon particles enlarges the electrodes 27/67 and eventually, the enlarged electrodes 27/67 becomes either restrict the fluid flow or causes a short between the electrodes 27/67 (see FIGS. 6-9) reducing efficiency, operational time, and eventually extinguishing the arc. Note that throughout this description, carbon bi-product buildup is addressed, though it is fully anticipated that, for other fluids, other bi-products are similarly prevented from building up on one or both electrodes 27/67.

Figure 4:
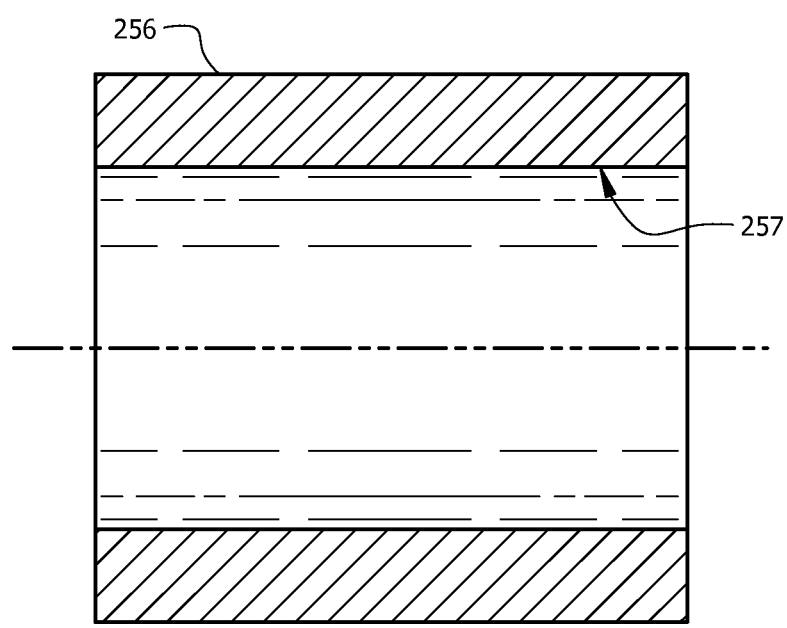
FIG. 4 illustrates a perspective view of a third, linear flow restrictor for a flow-through arc apparatus.

Referring to FIG. 4, a view of a third, linear-type restrictor 256 for a flow-through arc vessel 9 is shown. Although any shape and configuration of a flow restrictor 256 is anticipated, in the example shown, the flow restrictor 256 is substantially tubular having an inner surface that has a substantially linear surface 257. As will be shown with FIG. 8, as fluid is pumped through the flow restrictor 56, the velocity of the flow of fluid is in itself sufficient to reduce accumulation of carbon bi-products onto the electrodes 27/67, but in this example, the velocity of the fluid is a result of a pump operation and not due to a smaller cross-sectional area. This velocity of the fluid reduces accumulation of carbon bi-products onto the electrodes 27/67 since bi-products that are freed from the fluid by an electric arc are swept away by the flowing fluid before having a chance to deposit on the electrodes 27/67. For example, for a carbon-based fluid such as motor oil (used or new), cooking oil (used or new), and petroleum, the velocity of the fluid forces at least some of the carbon bi-products that are released from this fluid by the arc to be swept away with the fluid instead of allowing these carbon bi-products to deposit on the electrodes 27/67, which would eventually reduce arc efficiency and require maintenance or replacement of the electrodes 27/67. Such buildup of carbon particles enlarges the electrodes 27/67 and eventually, the enlarged electrodes 27/67 becomes either restrict the fluid flow or causes a short between the electrodes 27/67 (see FIGS. 6-9) reducing efficiency, operational time, and eventually extinguishing the arc. Note that throughout this description, carbon bi-product buildup is addressed, though it is fully anticipated that, for other fluids, other bi-products are similarly prevented from building up on one or both electrodes 27/67.

Figure 5:
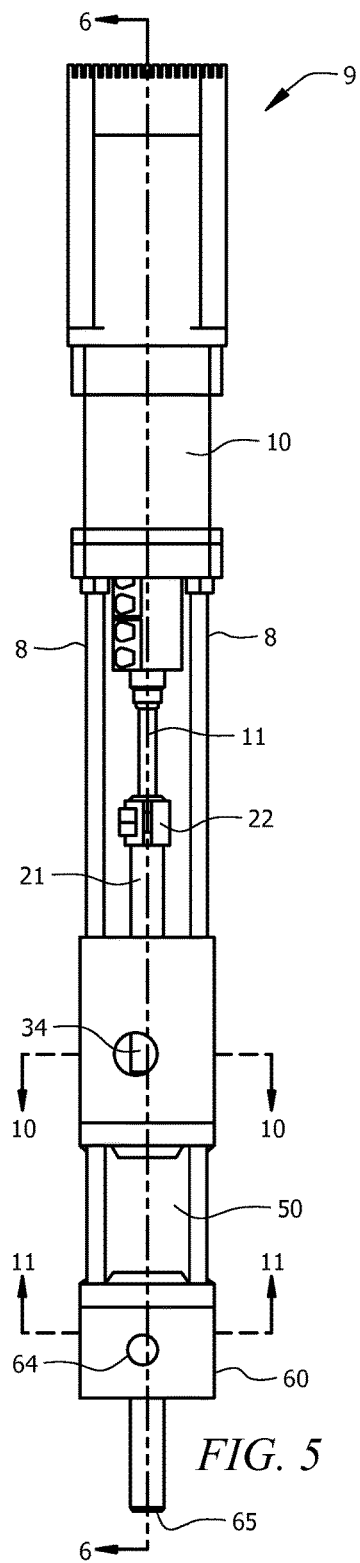
FIG. 5 illustrates a perspective view of a flow-through arc reactor.
Figure 6:
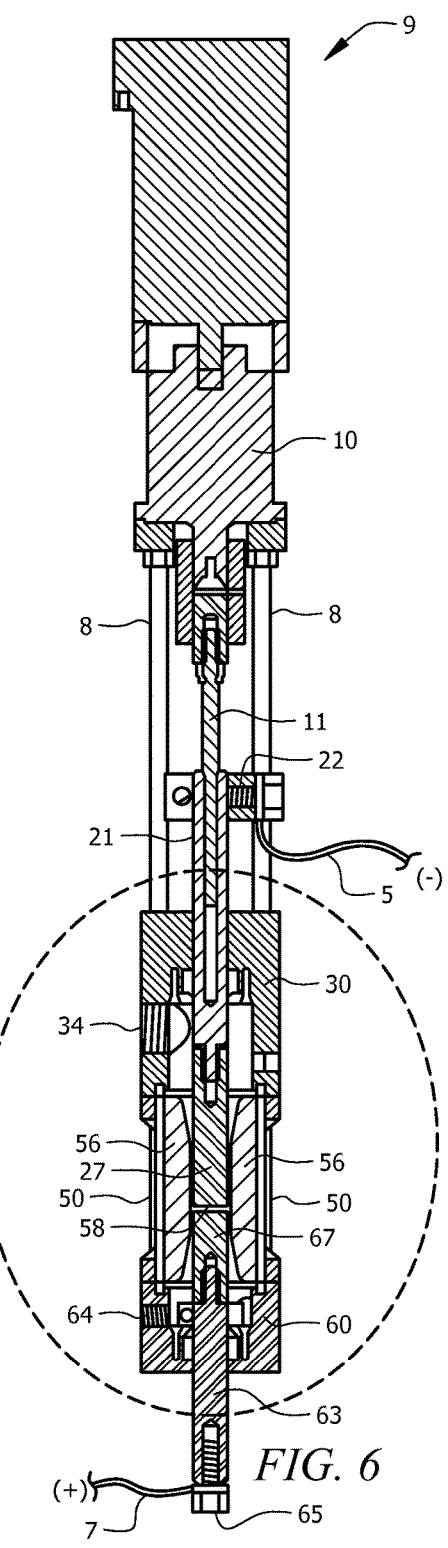
FIG. 6 illustrates a cut-away view along lines 6-6 of FIG. 5.

Referring to FIGS. 5 and 6, views of the complete flow-through arc assembly 9 are shown. Many of the components of the flow-through arc assembly 9 are shown for completeness such as the motor 10 that is used to control the gap between the electrodes 27/67. In this exemplary mechanism, the motor 10 drives a threaded shaft 11 that is threaded within the cathode shaft 21. As the motor 10 is energized to rotate in one direction, the threads on the threaded shaft 11 screw into the threads within the cathodes shaft 21, pulling the cathode 27 away from the anode 67. Likewise, as the motor 10 is energized to rotate in an opposing direction, the threads on the threaded shaft 11 screw out of the threads within the cathodes shaft 21, pushing the cathode 27 towards the anode 67. In this way, by controlling rotation of the motor 10, the gap 58 between the electrodes 27/67 is adjusted, for example, moved close to start the arc, moved away after starting the arc, and moved closer together or farther apart to adjust the arc as fluid composition changes or as the electrodes 27/67 are consumed.

In this example, the cathode shaft 21 and is connected to the cathode 27 and both are held and supported by an insulated cathode housing 30. An outlet port 34 in the cathode housing 30 provides for an exit for the fluid and any generated gases to exit from the vessel 9. The anode 67 is connected to an anode shaft 63 and both are held and supported by an insulated anode housing 60. An inlet port 64 in the anode housing 60 provides for an entry of the fluid into the vessel 9.

In this example, the cathode 27 and anode 67 are preferably enclosed within a vessel body 50, the vessel body 50 being preferably made of metal such as steel, stainless, nickel, and/or copper.

The cathode shaft 21 has a connection block 22 that is electrically connected to a source of power 5, which conducts through the cathode shaft 21 to the cathode 27. Likewise, the anode shaft 63 is connected to a source of power 7 of opposite polarity (e.g., by a fastener 65), which is conducted through the anode shaft 63 to the anode 67. The potential between the cathode 27 and the anode 67 cause an arc to form in the gap 58 between the cathode 27 and the anode 67 and within the vessel body 50.

For completeness, metal support rods 8 are shown. In this example, the metal support rods 8 physically support the motor 10, cathode housing 30 and anode housing 60, though there are many ways to physically support the motor 10, cathode housing 30 and anode housing 60, all of which are equally anticipated and included here within.

Figure 7:
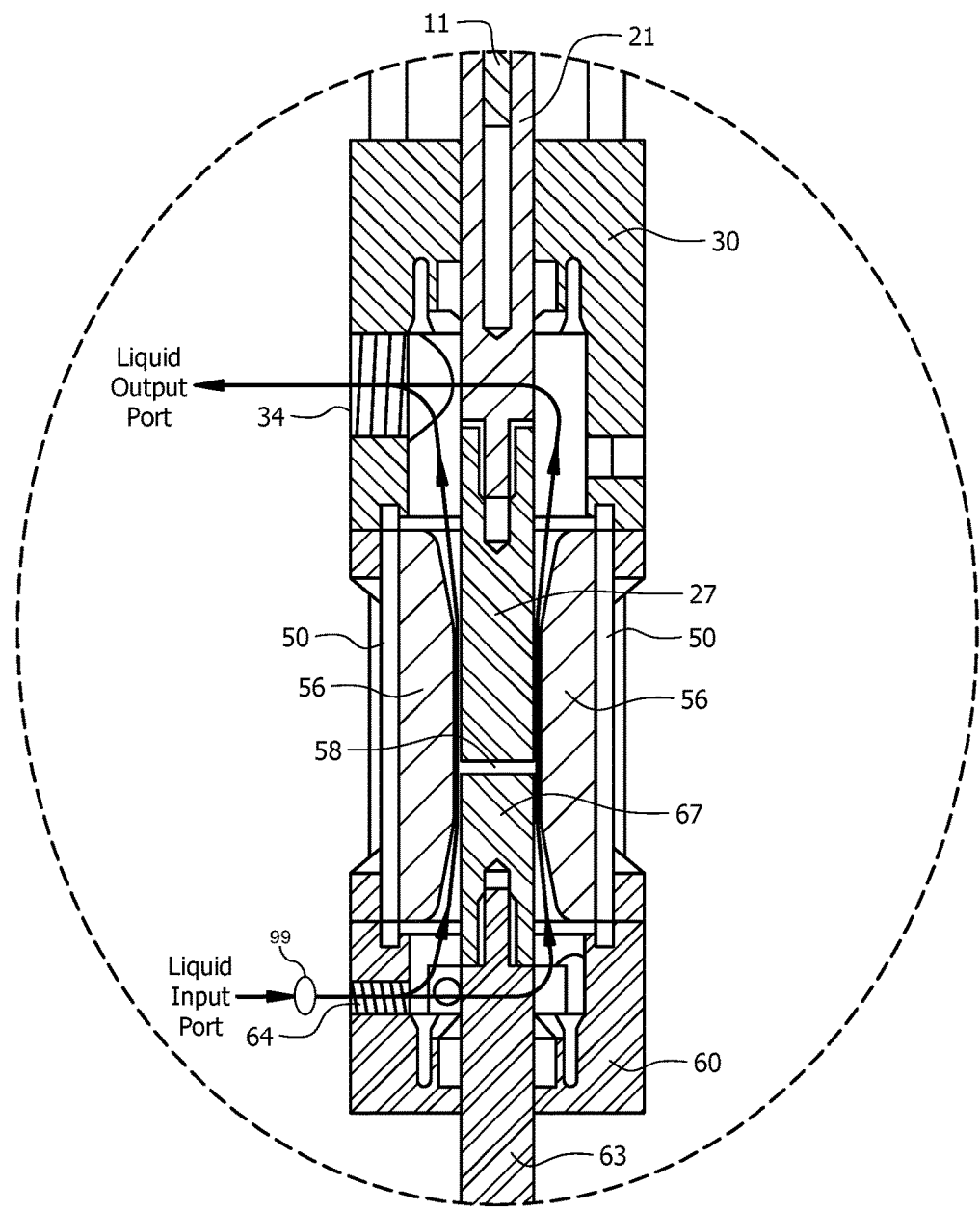
FIG. 7 illustrates a magnified view of a flow-through arc apparatus with the venturi style flow restrictor.

In FIGS. 6 and 7, the flow-through arc apparatus is shown having a venturi-shaped sleeve 56 between the inner surface of vessel body 50 and the electrodes 27/67. An arc is formed in the gap 58 between two electrodes 27/67. Fluid flows into the vessel 9 through the inlet port 64, generally in parallel with an axis of the electrodes, through a gap between the inner surface of the sleeve 56 and the electrodes 27/67. The fluid is exposed to the arc that is formed in the gap 58 between the anode 67 and the cathode 27, then the fluid along with any generated gases flows out through the outlet port 34.

The fluid enters the inlet port 64 at a certain pressure (e.g. by way of a pump 99), resulting in a flow velocity of the fluid at the entry to the sleeve 56, where the sleeve 56 has a cross-sectional area. As the fluid flows into the sleeve 56, the fluid flows into an area that has a smaller cross-sectional area, resulting in an increased flow velocity. A number of bi-products are released from the fluid as a result of the fluid being exposed to the arc. For example, if the fluid is carbon-based such as motor oil, cooking oil, etc., a number of bi-products are released. Prior, these bi-products (e.g., carbon atoms) would migrate to the electrodes 27/67 and collect on the electrodes 27/67, causing buildup of material (e.g., carbon) on one or both of the electrodes 27/67. The fluid, moving at the increased flow velocity past the arc created in the gap 58 between the electrodes 27/67 reduces the number of these bi-products (e.g., carbon atoms) that will have an opportunity to collect on the electrodes 27/67, and instead, these bi-products (e.g., carbon atoms) are swept away with the fluid and any gases that are produced by this reaction and exit the outlet port 34 of the cathode housing 30.

In some embodiments, during operation of the arc, the cathode 27 is moved towards or away from the electrode through operation of the motor 10. As the motor turns in one direction, the electrodes 27/67 move closer together and as the motor turns in an opposite direction, the electrodes 27/67 move farther apart. This is but one example of how location of the electrodes 27/67 are changed and the present invention is not limited in any way to any particular mechanism for adjusting the electrodes 27/67 and, hence, adjustment of the gap 58 between the electrodes 27/67, and consequently, the arc itself. Any system for controlling and tuning the gap 58 and therefore, the arc, is fully anticipated and included here within.

The cathode 27 is held in a preferably non-conductive cathode housing 30 and connected to power 5 through, for example, a connection block 22. The anode is held in a second, preferably non-conductive anode housing 60. Power 7 is connected to the anode 67 through the anode shaft 63, for example, at a connection point 65 on the anode shaft 63.

The arc is formed in the gap 58 between the electrodes 27/67. The electrodes 27/67 are confined within the inner bore of an insulated sleeve 56. With such, the source fluid is channeled through the restrictor sleeve 56 at a rate that reduces buildup of bi-products on the electrodes 27/67, as would happen if the electrodes 27/67 were simply immersed within the fluid. A faster the flow of the fluid through the restrictor sleeve 56, generally results in less buildup on the electrodes 27/67. The restrictor sleeve 56 is preferably made of a nonconductive material such as ceramic, granite, refractory, phenolic, alumina, and zirconia. The vessel body 50 that surrounds the restrictor sleeve is preferably made of a strong, metallic material such as steel, stainless steel, iron, nickel, etc. The vessel body 50 helps contain pressure that is present within the chamber restrictor sleeve 56.

The restrictor sleeve 56 is, for example, generally tubular. In this example, the restrictor sleeve 56 is double tapered to form a venturi (as shown). In this, the overall cross-sectional area of the restrictor sleeve 56 is greater at both ends (input end and exit end) than the overall cross-sectional area of the middle area of the restrictor sleeve 56 (in the area of the gap 58). This restriction in the area of the gap 58 causes the fluid to flow at a greater rate at the area of restriction as per the venturi principles. Note that to avoid undue fluid flow restriction, in some embodiments the restrictor sleeve 56 has an entry cone (angle of constriction near the anode 67) of approximately 30 degrees and an exit cone (angle of divergence near the cathode 27) of approximately 5 degrees.

In operation, a fluid is pumped by a pump 99 into the anode housing 60 of the vessel 9 through the inlet port 64, through the restrictor sleeve 56 for exposure to the arc formed within the gap 58 where exposure to the arc generates gases. Remaining fluid and gases flow out of the cathode housing 30 through the outlet port 34. Upon exiting the outlet port 34, the gases are separated from the fluid and collected; then, in some embodiments, the fluid is circulated/pumped back into the inlet port 64. In some such embodiments, the cited carbon bi-products (e.g., carbon atoms) are removed from the fluid (e.g. by electrostatic attraction or by filtering) before the fluid is circulated/pumped back into the inlet port 64.

Again, as the fluid enters at a specific flow rate, the flow rate increases as the cross-sectional area of the restrictor sleeve 56 reduces, thereby flowing at an even greater rate in the area of the gap 58. This higher rate of flow reduces potential for carbon bi-products (or molecules) that are freed from the fluid to migrate to the electrodes 27/67 and collect on the surface of the electrodes 27/67. Therefore, there is less buildup of bi-products on the electrodes 27/67 and within the vessel 9, resulting in longer operating periods of time before one or both of the electrodes 27/67 require cleaning and/or replacement.

The arc within the gap 58 is energized by applying appropriate power to the cathode 27 and anode 67 through the cathode shaft 21 (no 23 in pictures) and the anode shaft 63. Since the cathode shaft 21 moves in a linear direction, in the embodiments shown, a cathode power connection block 22 is electrically and physically attached to the cathode shaft 21 for connection to power. It is anticipated that a flexible/bendable power cable 5 connects power to the cathode power connection block 22 so as to allow for movement of the cathode shaft 21.

Fluid flows, preferably under pressure, into the anode housing 60 through an inlet port 64. The fluid flows in a space between the bore within the insulated sleeve 56 and the electrodes 27/67. When the fluid passes the gap 58, the fluid is exposed to the arc 58 for treatment and generation of gas. Finally, the fluid and generated gases flow through the cathode housing 20 and out of an outlet port 34. Note that flow in either direction is anticipated.

Figure 8:
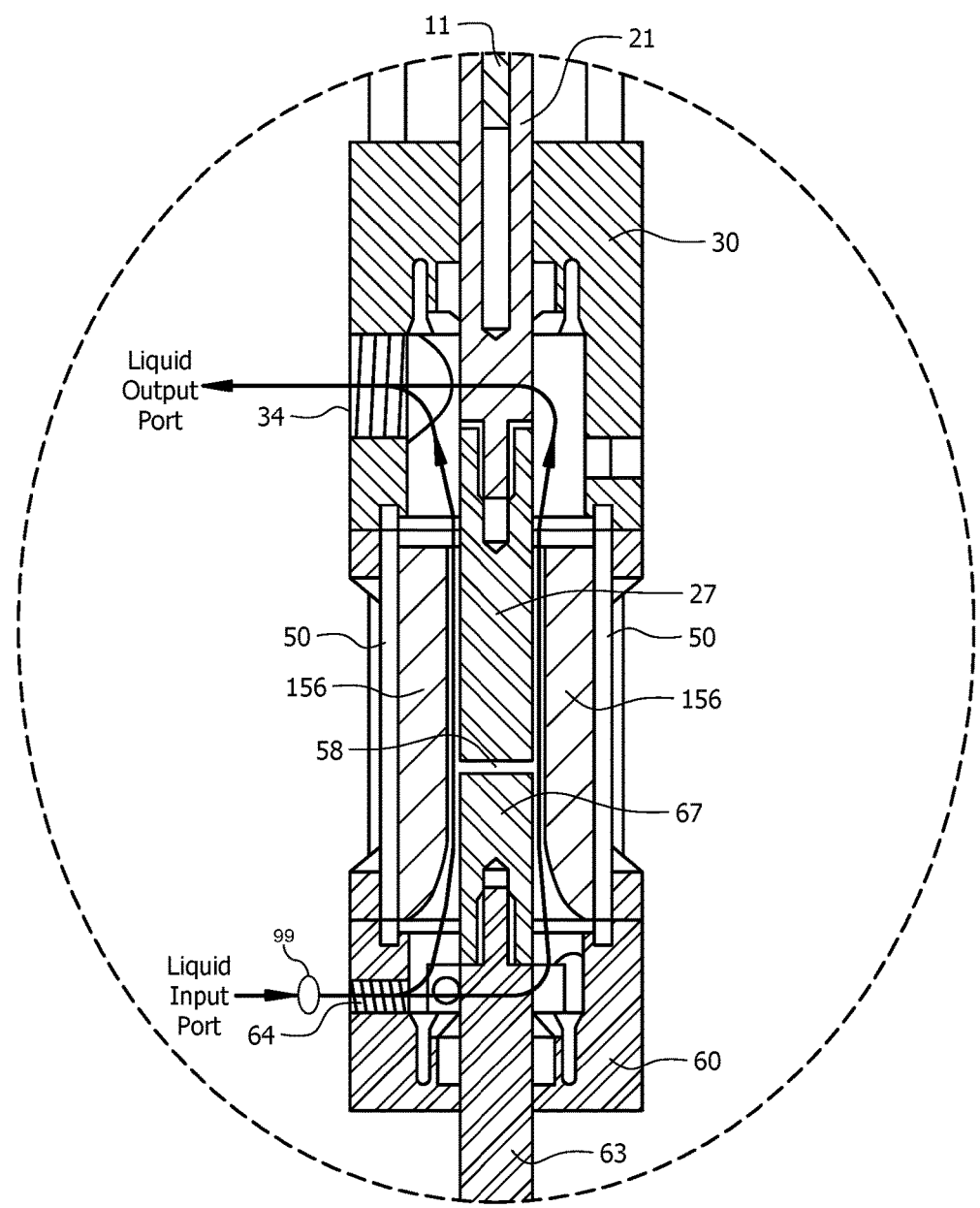
FIG. 8 illustrates a magnified view of a flow-through arc apparatus with the tapered flow restrictor.

Referring to FIG. 8, the flow-through arc apparatus is shown having a tapered sleeve 156 between the inner surface of vessel body 50 and the electrodes 27/67. An arc is formed in the gap 58 between two electrodes 27/67. Fluid flows into the vessel 9 through the inlet port 64, through a gap between the inner surface of the sleeve 156 and the electrodes 27/67. The fluid is exposed to the arc that is formed in the gap 58 between the anode 67 and the cathode 27, then the fluid along with any generated gases flows out through the outlet port 34.

The fluid enters the inlet port 64 at a certain pressure (e.g. by way of a pump 99), resulting in a flow velocity of the fluid at the entry to the sleeve 156, where the sleeve 156 has a larger cross-sectional area. As the fluid flows into the sleeve 156, the fluid flows into an area that has a smaller cross-sectional area, resulting in an increased flow velocity. A number of carbon bi-products are released from the fluid as a result of the fluid being exposed to the arc. For example, if the fluid is carbon-based such as motor oil, cooking oil, etc., a number of carbon bi-products are released. Prior, these bi-products (e.g., carbon atoms) would migrate to the electrodes 27/67 and collect on the electrodes 27/67, causing buildup of material (e.g., carbon) on the electrodes 27/67. The fluid, moving at the increased flow velocity past the arc created in the gap 58 between the electrodes 27/67 reduces the number of these bi-products (e.g., carbon atoms) that will have an opportunity to collect on the electrodes 27/67, and instead, these bi-products (e.g., carbon atoms) are swept away with the fluid and any gases that are produced by this reaction and exit the outlet port 34 of the cathode housing 30.

The arc is formed in the gap 58 between the electrodes 27/67. The electrodes 27/67 are confined within the inner bore of an insulated sleeve 156. With such, the fluid is channeled through the restrictor sleeve 156 at a rate that reduces buildup of bi-products on the electrodes 27/67, as would happen if the electrodes 27/67 were simply immersed within the fluid. A faster flow of the fluid through the restrictor sleeve 156, generally results in less buildup on the electrodes 27/67. The restrictor sleeve 156 is preferably made of a non-conductive material such as ceramic and the vessel body 50 that surrounds the restrictor sleeve is preferably made of a strong, metallic material such as steel. The vessel body 50 helps contain pressure that is present within the chamber restrictor sleeve 156.

The restrictor sleeve 156 is, for example, generally tubular. In the tapered restrictor sleeve 156 a single taper reduces the overall cross-sectional area of the restrictor sleeve 156 from a greater cross-sectional area at an input end to a smaller overall cross-sectional area along the remainder of the restrictor sleeve 156, including the area surrounding the gap 58. This restriction in the area of the gap 58 causes the fluid to flow at a greater velocity at the area of restriction. Note that to avoid undue fluid flow restriction, in some embodiments the restrictor sleeve 156 has an entry cone (angle of constriction near the anode 67) of approximately 30 degrees.

Figure 9:
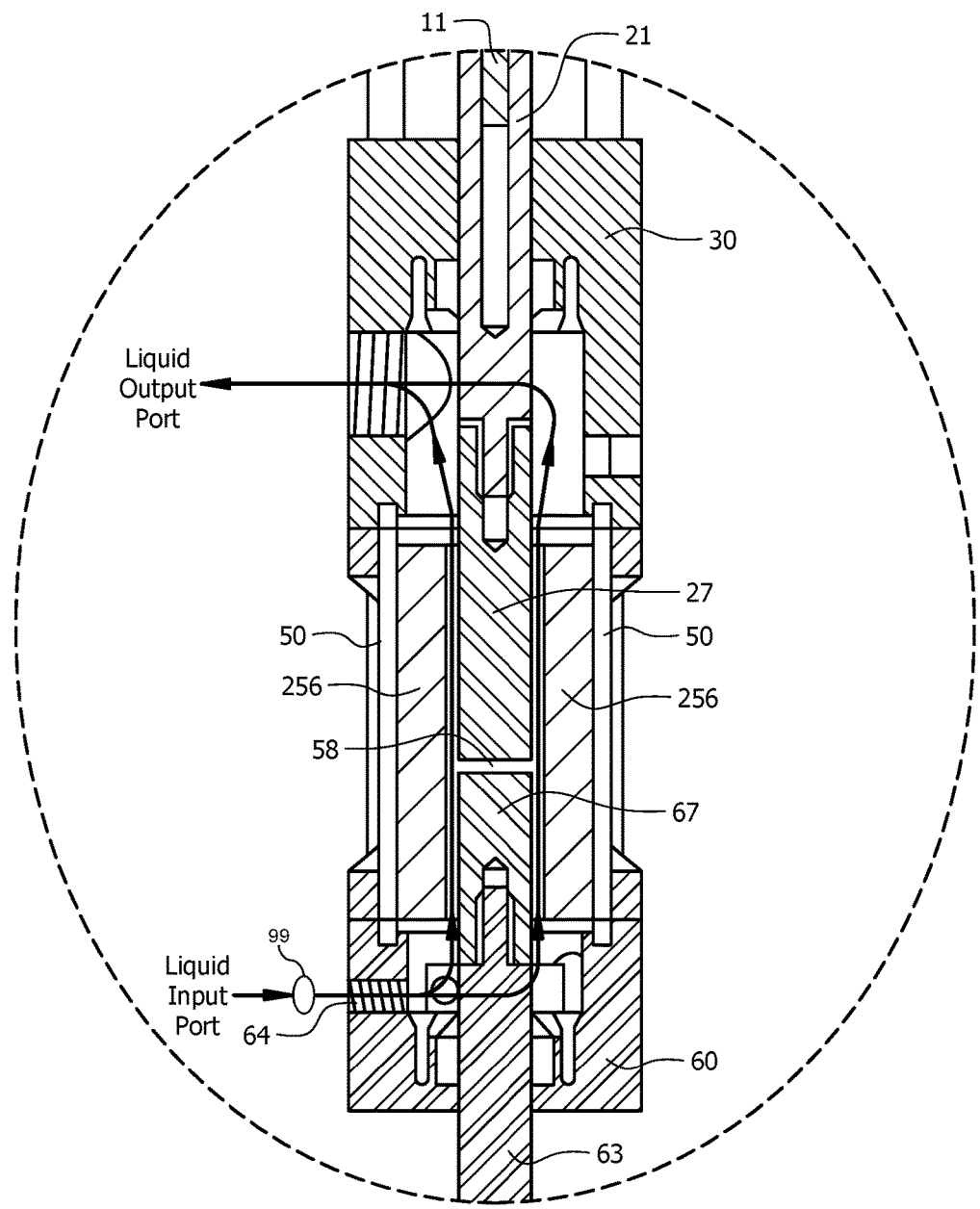
FIG. 9 illustrates a magnified view of a flow-through arc apparatus with the linear flow restrictor.

Referring to FIG. 9, the flow-through arc apparatus is shown having a linear sleeve 256 between the inner surface of vessel body 50 and the electrodes 27/67. An arc is formed in the gap 58 between two electrodes 27/67. Fluid flows into the vessel 9 through the inlet port 64, through a gap between the inner surface of the sleeve 256 and the electrodes 27/67. The fluid is exposed to the arc that is formed in the gap 58 between the anode 67 and the cathode 27, then the fluid along with any generated gases flows out through the outlet port 34.

The fluid enters the inlet port 64 at a certain pressure (e.g. by way of a pump 99), resulting in a specific flow velocity of the fluid through the sleeve 256. In this embodiment, the sleeve 256 has a substantially constant cross-sectional area, resulting in a flow velocity that is dependent upon the pressure supplied at the inlet port 64. A number of bi-products are released from the fluid as a result of the fluid being exposed to the arc. For example, if the fluid is carbon-based such as motor oil, cooking oil, etc., a number of carbon bi-products are released. Prior, these bi-products (e.g., carbon atoms) would migrate and collect on one or both of the electrodes 27/67, causing a buildup of material (e.g., carbon) on the electrodes 27/67. The fluid, moving at the resulting velocity past the arc created in the gap 58 between the electrodes 27/67 reduces the number of these bi-products (e.g., carbon atoms) that will have an opportunity to collect on the electrodes 27/67, and instead, these bi-products (e.g., carbon atoms) are swept away with the fluid and any gases that are produced by this reaction and exit the outlet port 34 of the cathode housing 30.

The arc is formed in the gap 58 between the electrodes 27/67. The electrodes 27/67 are confined within the inner bore of an insulated sleeve 256. With such, the fluid is channeled through the linear restrictor sleeve 256 at a rate that reduces buildup of bi-products on the electrodes 27/67, as would happen if the electrodes 27/67 were simply immersed within the fluid. A faster velocity of the fluid through the restrictor sleeve 256, generally results in less buildup on the electrodes 27/67. The restrictor sleeve 256 is preferably made of a nonconductive material such as ceramic and the vessel body 50 that surrounds the restrictor sleeve is preferably made of a strong, metallic material such as steel. The vessel body 50 helps contain pressure that is present within the chamber restrictor sleeve 256.

The restrictor sleeve 256 is, for example, generally tubular with a substantially constant overall cross-sectional area, including the area surrounding the gap 58. Therefore, the velocity of the fluid is not increased substantially by the restrictor sleeve 256 and is dependent upon the pressure of the fluid as provided at the inlet port 64.

In operation, a fluid is pumped by a pump 99 into the anode housing 60 of the vessel 9 through the inlet port 64, through the restrictor sleeve 256 for exposure to the arc formed within the gap 58 where exposure to the arc generates gases, and remaining fluid and gases flow out of the cathode housing 30 through the outlet port 34. Upon exiting the outlet port 34, the gases are separated from the fluid and collected; then, in some embodiments, the fluid is circulated/pumped back into the inlet port 64. In some such embodiments, the cited bi-products (e.g., carbon atoms) are removed from the fluid (e.g. by electrostatic attraction or by filtering) before the fluid is circulated/pumped back into the inlet port 64

Again, the fluid enters at a specific flow rate or velocity and, therefore, the flow within the restrictor sleeve 256 in the area of the gap 58 is dependent upon the flow rate. This higher rate of flow reduces potential for bi-products (or molecules) that are freed from the fluid to migrate to the electrodes 27/67 and collect on the surface of the electrodes 27/67. Therefore, there is less buildup of, for example, carbon bi-products on the electrodes 27/67 and the vessel 9, for example, is capable of operating for longer periods of time before one or both of the electrodes 27/67 require cleaning and/or replacement.

The arc within the gap 58 is energized by applying appropriate power to the cathode 27 and anode 67 through the cathode shaft 21 and the anode shaft 63. Since the cathode shaft 21 moves in a linear direction, in the embodiments shown, a cathode power connection block 22 is electrically and physically attached to the cathode shaft 21 for connection to power. It is anticipated that a flexible/bendable power cable 5 connects power to the cathode power connection block 22 so as to allow for movement of the cathode shaft 21.

Fluid flows, preferably under pressure, into the anode housing 60 through an inlet port 64. The fluid flows through the space between the insulated sleeve 256 and the electrodes 27/67 where the fluid is exposed to the arc 58 for treatment and generation of a gas. Finally, the fluid and any generated gases flow through the cathode housing 30 and out of an outlet port 34. Note that flow in either direction is anticipated.

Figure 10:
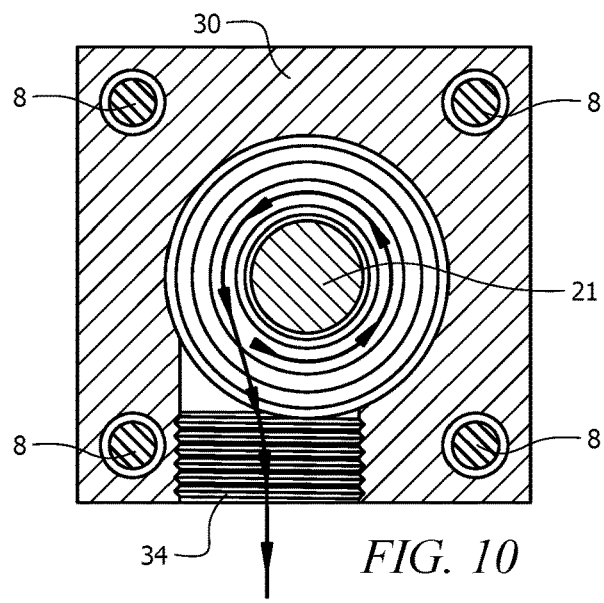
FIG. 10 illustrates a cut-away view of the cathode housing of FIG. 5 along lines 10-10.

Referring to FIG. 10, a cut-away view of the cathode housing 30 is shown. Fluid is shown exiting the space between the cathode shaft 21 and the inner surface of the sleeve 56/156/256 and flowing out of the outlet port 34. As discussed, the cathode housing 30 is held in place by, for example metal support rods 8.

Figure 11:
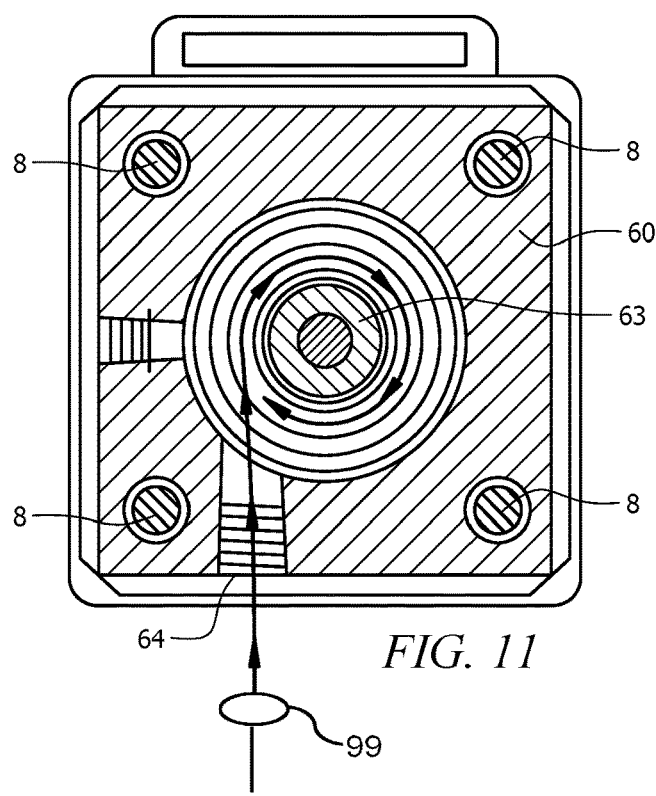
FIG. 11 illustrates a cut-away view of the anode housing of FIG. 5 along lines 11-11.

Referring to FIG. 11, a cut-away view of the anode housing 60 is shown. Fluid is shown entering the inlet port 64 then flowing into the space between the anode shaft 63 and the inner surface of the sleeve 56/156/256. As discussed, the anode housing 60 is held in place by, for example metal support rods 8.

In one exemplary use, used cooking oil is pumped into the inlet port 64 by the pump 99. As the used cooking oil flows through the restrictor sleeve 56/156, the velocity of the cooking oil increases as the used cooking oil is exposed to the arc formed in the gap 58. Upon exposure to the arc, at least some of the used cooking oil is separated by electrolysis into a gas (e.g. hydrogen) with some number of free bi-products such as carbon remaining. These free bi-products (e.g., carbon) are swept away by the fluid (used cooking oil) and some such bi-products (e.g., carbon) are prevented from accumulating on the electrodes 27/67. Because of the heat and ignition source provided by the arc, there is some tendency for the produced gas to ignite. Because of the velocity of the used cooking oil through the restrictor sleeve 56/156, such ignition is at least partially suppressed. This results in a more efficient capture of a clean-burning gas from the used cooking oil.

Likewise, in this exemplary use in the apparatus 9 having a linear restrictor 256, used cooking oil is pumped at a higher pressure into the inlet port 64. As the used cooking oil flows through the restrictor sleeve 256, the velocity of the cooking oil is already high due to the higher pressure. As the used cooking oil is exposed to the arc formed in the gap 58, at least some of the used cooking oil is separated by electrolysis into a gas (e.g. hydrogen) with some number of free bi-products such as carbon remaining. These free bi-products (e.g., carbon) are swept away by the fluid (used cooking oil) and some such bi-products (e.g., carbon) are prevented from accumulating on the electrodes 27. Because of the heat and ignition source provided by the arc, there is some tendency for the produced gas to ignite. Because of the velocity of the used cooking oil through the restrictor sleeve 256, such ignition is at least partially suppressed. This results in a more efficient capture of a clean-burning gas from the used cooking oil.

The restrictor 56/156/256 is, preferably but not required, to be designed commensurate with the fluid (feedstock type) and/or application (e.g., sterilization or gasification). For the gas production application with the fluid being, for example, used cooking oil, the restrictor 56 (venturi type) tapers 57 to the narrowest cross-sectional area just before the gap 58, and therefore, has maximum flow at the gap 58. In this application, the reverse taper 59 of the restrictor 56 is just past the electrode gap 58.

For sterilization applications with, for example, water and suspended waste products as the feedstock, either restrictor 56/156/256 is anticipated.

The restrictor 56/156/256 is preferably made of a material that has a high electrical resistance (e.g., the material is a good insulator), has a high tolerance to thermal shock, and has a high operating temperature. The high operating temperature is required due to the high temperatures generated by the plasma arc, for example temperatures that range between 10,000 degrees and 12,000 degrees Fahrenheit). Although many materials are suitable for construction of the restrictor 56/156/256, granite, ceramics (alumina and zirconia), refractory materials (e.g., refractory cement), and porcelain are fully anticipated.

Equivalent elements can be substituted for the ones set forth above such that they perform in substantially the same manner in substantially the same way for achieving substantially the same result. It is believed that the system and method as described and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely exemplary and explanatory embodiment thereof. It is the intention of the following claims to encompass and include such changes.

What is claimed is:

1. A system for the production of a gas from a fluid, the system comprising:
    an anode connected to a first polarity of power;
    a cathode connected to a second, opposing polarity of power, the cathode separated from the anode by a gap, whereby a voltage differential between the anode and the cathode forms an arc there between;
    a sleeve having a bore, the bore surrounding at least the gap between the anode and the cathode, the sleeve comprising of an electrical insulator, the bore forming a venturi that has a wider cross-sectional area at each end of the bore and a narrower cross-sectional area at a location of the gap;
    an input port fluidly interfaced to a first end of the bore;
    an output port fluidly interfaced to a second end of the bore;
    means for flowing the fluid from the input port, through the bore of the sleeve, and out of the output port such that the fluid flows from an area around the anode to an area around the cathode or from the area around the cathode to the area around the anode; and
    a vessel body made of a metallic material covering an outer surface of the sleeve;
    whereas, at least some of the bi-products that are released from the fluid by the reaction are prevented from accumulating on either the anode or the cathode.

2. The system of claim 1, wherein the bore within the venturi having the narrower cross-sectional area at a central area of the bore at the gap than at the first end of the bore and the second end of the bore, causes a velocity of the fluid through the central area of the bore greater than a velocity of the fluid at the first end of the bore.

3. The system of claim 1, wherein at least an end of the anode is positioned within the first end of the bore and at least an end of the cathode is positioned within the second end of the bore, and the gap between the anode and the cathode is positioned within a central area of the bore.

4. The system of claim 1, wherein the fluid is carbon-based.

5. The system of claim 1, wherein the sleeve is made of a material selected from the group consisting of ceramic, refractory, granite, zirconia, and alumina.

6. A system for the production of a gas from a carbon-based fluid, the system comprising:
    an anode connected to a first polarity of power;
    a cathode connected to a second, opposing polarity of power, the cathode separated from the anode by a gap, whereby a voltage differential between the anode and the cathode forms an arc there between;
    a sleeve having a longitudinal bore, the longitudinal bore forming a venturi that has a smaller cross-sectional area at an area of the longitudinal bore surrounding the gap than at a first end of the longitudinal bore and a second end of the longitudinal bore, the longitudinal bore surrounding at least the gap between the anode and the cathode, the sleeve being made of a material that is an insulator of electricity;
    a metallic material covering an outer surface of the sleeve;
    an input port fluidly interfaced to the first end of the longitudinal bore at the anode;
    an output port fluidly interfaced to the second end of the longitudinal bore at the cathode; and
    a pump, the pump flowing the carbon-based fluid from the input port, through the longitudinal bore of the sleeve, and out of the output port; whereas, at least some of the carbon bi-products that are released from the carbon-based fluid by the reaction are prevented from accumulating on either of the anode or the cathode.

7. The system of claim 6, wherein a velocity of the fluid through the area of the longitudinal bore is greater than a velocity of the fluid at the first end of the longitudinal bore.

8. The system of claim 7, wherein the longitudinal bore within the sleeve is tapered having a first cross-sectional area at the central area of the longitudinal bore and at the second end of the longitudinal bore, and having a second cross-sectional area at the first end of the longitudinal bore wherein the first cross-sectional area is smaller than the second cross-sectional area, thereby the velocity of the fluid through the central area of the longitudinal bore is greater than the velocity of the fluid at the first end of the longitudinal bore.

9. The system of claim 7, further comprising means to adjust the gap between the anode and the cathode.

* * * * *